US009865606B2

(12) United States Patent
Tanaka et al.

(10) Patent No.: US 9,865,606 B2
(45) Date of Patent: Jan. 9, 2018

(54) SEMICONDUCTOR DEVICE AND SEMICONDUCTOR MEMORY DEVICE

(71) Applicant: Kabushiki Kaisha Toshiba, Tokyo (JP)

(72) Inventors: Chika Tanaka, Kanagawa (JP); Daisuke Matsushita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 15/062,870

(22) Filed: Mar. 7, 2016

(65) Prior Publication Data

US 2016/0276351 A1 Sep. 22, 2016

(30) Foreign Application Priority Data

Mar. 19, 2015 (JP) .................. 2015-056490

(51) Int. Cl.
*H01L 29/08* (2006.01)
*H01L 27/11* (2006.01)
*H01L 29/739* (2006.01)

(52) U.S. Cl.
CPC ...... *H01L 27/1116* (2013.01); *H01L 27/1104* (2013.01); *H01L 29/0834* (2013.01); *H01L 29/7391* (2013.01)

(58) Field of Classification Search
CPC ............. H01L 29/0847; H01L 29/1083; H01L 29/786
See application file for complete search history.

(56) References Cited

U.S. PATENT DOCUMENTS

2010/0163845 A1* 7/2010 Goel ................ H01L 29/205
257/24
2012/0326239 A1 12/2012 Sasaki et al.
2014/0091396 A1 4/2014 Hokazono

FOREIGN PATENT DOCUMENTS

JP 2013-8795 1/2013
JP 2013-74288 4/2013
JP 2014-72338 4/2014

* cited by examiner

*Primary Examiner* — Mark Prenty
(74) *Attorney, Agent, or Firm* — Finnegan, Henderson, Farabow, Garrett & Dunner, L.L.P.

(57) ABSTRACT

According to one embodiment, a semiconductor device includes a first region having a first conductivity type in a semiconductor region; a second region having a second conductivity type in the semiconductor region; a gate electrode above a first part of the semiconductor region between the first region and the second region; a gate insulating layer between the first part and the gate electrode; a third region having the first conductivity type below the second region; and a fourth region across the second region and the third region and including a first impurity.

20 Claims, 8 Drawing Sheets

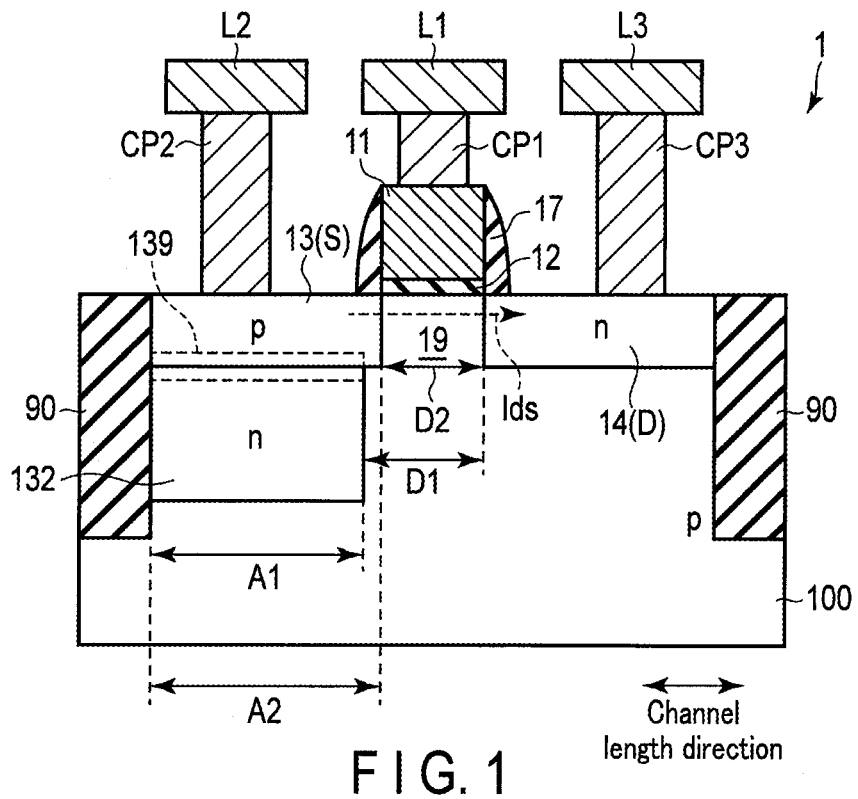
F I G. 1
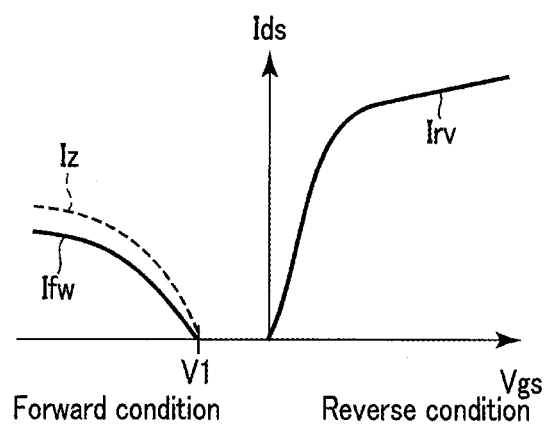
F I G. 2

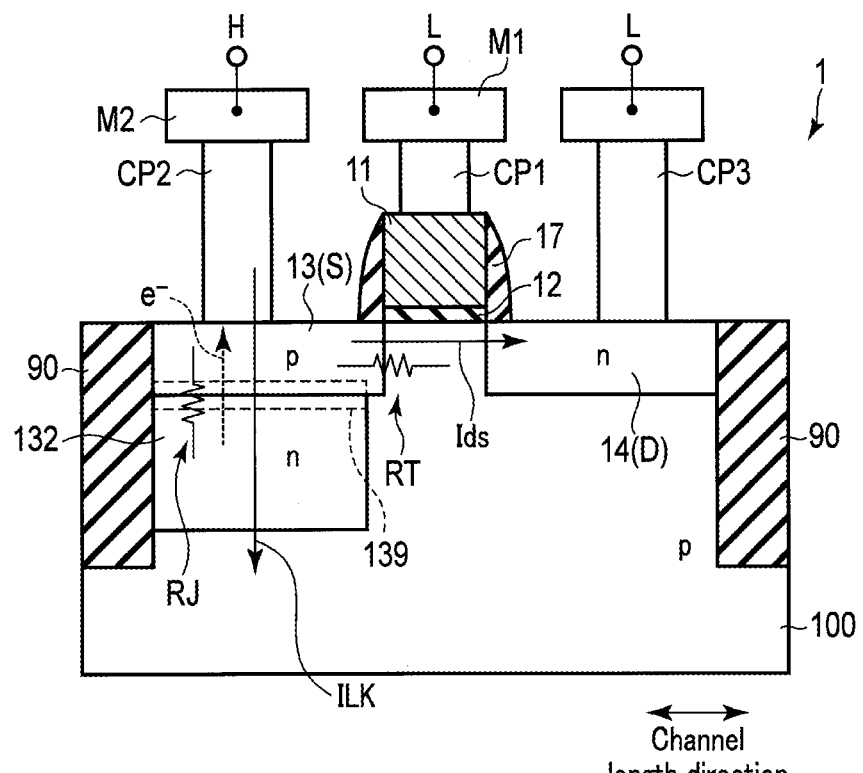
F I G. 3
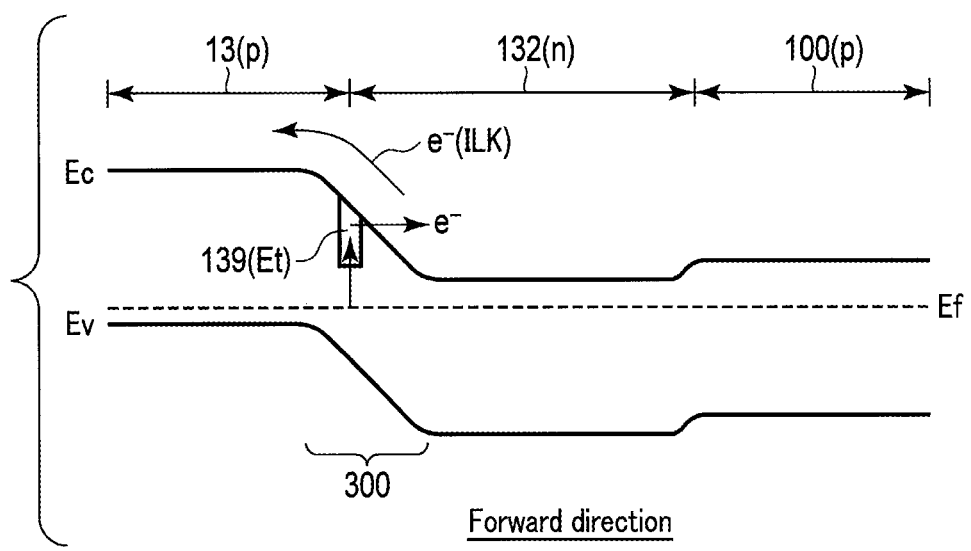
F I G. 4

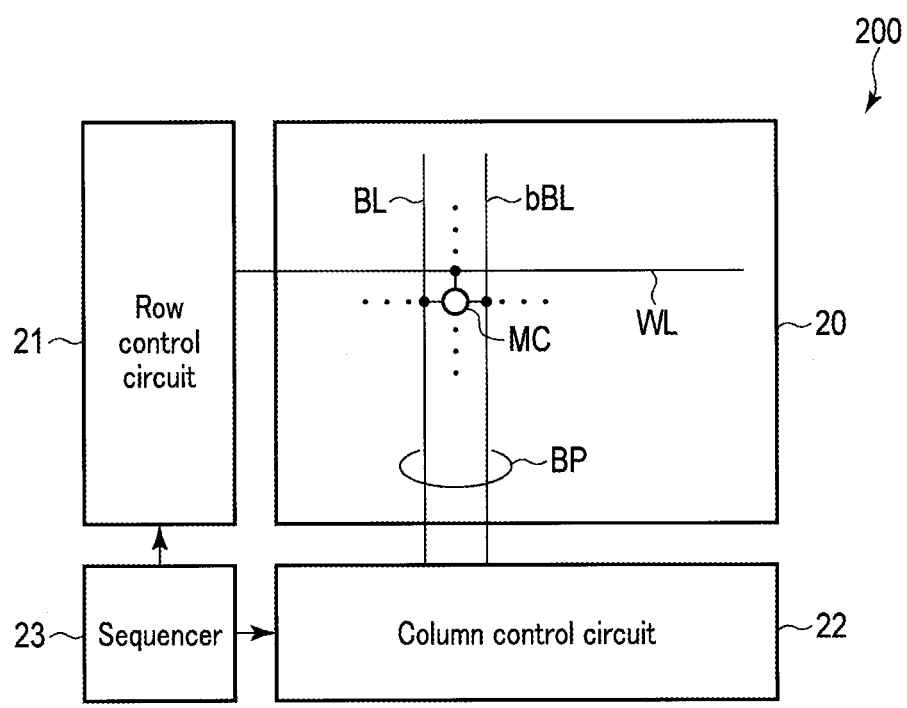
F I G. 9

SEMICONDUCTOR DEVICE AND SEMICONDUCTOR MEMORY DEVICE

CROSS-REFERENCE TO RELATED APPLICATIONS

This application is based upon and claims the benefit of priority from Japanese Patent Application No. 2015-056490, filed Mar. 19, 2015, the entire contents of which are incorporated herein by reference.

FIELD

The present embodiment relates to a semiconductor device and a semiconductor memory device.

BACKGROUND

In recent years, tunnel transistors have been researched and developed as new semiconductor devices. The tunnel transistor is a field effect transistor in which a source diffusion layer is different from a drain diffusion layer in conductivity type.

Studies are underway to apply the tunnel transistor to a logical circuit, a semiconductor memory, and the like in order to reduce power consumption of an electronic device and to increase an operating speed of the electronic device.

BRIEF DESCRIPTION OF THE DRAWINGS

FIG. 1 is a diagram illustrating a structure example of a semiconductor device in an embodiment;

FIG. 2 is a diagram illustrating operations of the semiconductor device in the embodiment;

FIG. 3 and FIG. 4 are schematic diagrams illustrating operations of the semiconductor device in the embodiment;

FIG. 9 and FIG. 10 are diagrams depicting an application example of the semiconductor device in the embodiment;

DETAILED DESCRIPTION

Figure 5:
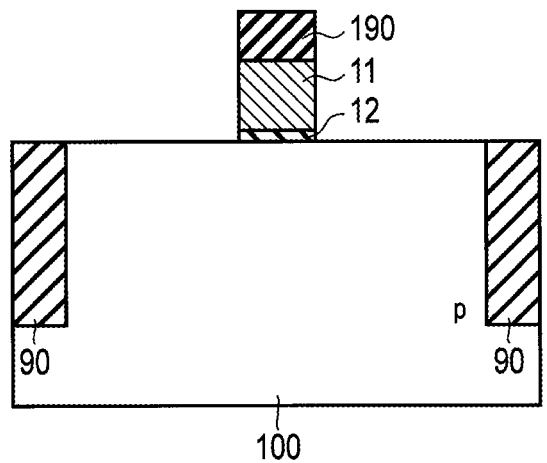
FIGS. 5, 6, 7 and 8 are sectional views illustrating steps of a method for manufacturing a semiconductor device in the embodiment.

In general, according to one embodiment, a semiconductor device includes a first region having a first conductivity type in a semiconductor region; a second region having a second conductivity type in the semiconductor region; a gate electrode above a first part of the semiconductor region between the first region and the second region; a gate insulating layer between the first part and the gate electrode; a third region having the first conductivity type below the second region; and a fourth region across the second region and the third region and including a first impurity.

Embodiment

With reference to FIGS. 1 to 13, a semiconductor device in an embodiment and a semiconductor memory device including the semiconductor device in the embodiment will be described.

(1) Structure Example

FIG. 1 is a sectional view depicting the basic structure of the semiconductor device in the embodiment.

The semiconductor device in the embodiment is a field effect transistor.

FIG. 1 depicts the sectional structure of the transistor in a channel length direction.

As depicted in FIG. 1, a field effect transistor 1 is disposed on a semiconductor region (for example, a semiconductor substrate) 100. A formation region for the field effect transistor 1 is defined by an element isolation insulating layer 90.

The field effect transistor 1 includes at least a source diffusion layer (source region) 13 in a semiconductor region 100, a drain diffusion layer (drain region) 14 in the semiconductor region 100, a gate insulating layer 12 on an region 19 (hereinafter referred to as a channel region) between the source diffusion region 13 and the drain diffusion region 14, and a gate electrode 11 on the gate insulating layer 12.

The semiconductor region 100 is a region including silicon (Si) or germanium (Ge) as a main component. For example, the semiconductor region 100 is a single-crystal silicon region (for example, a silicon bulk substrate), a polycrystalline silicon region, a germanium region, or a silicon germanium region.

The gate electrode 11 is a metal layer (for example, an alloy layer), a conductive silicon layer, a conductive germanium layer, a silicon compound layer (for example, a silicide layer), a germanium compound layer (for example, a germanide layer), or a conductive compound layer (for example, a conductive nitride layer of titanium or tantalum).

The gate insulating layer 12 is an insulating layer including silicon as a main component, an insulating layer including germanium as a main component, or a high-dielectric insulating layer (high-k layer).

The gate electrode 11 and the gate insulating layer 12 may each have a stack structure including a plurality of layers.

Various materials used for the transistor 1 are preferably selected as needed in view of the characteristics of the materials (for example, a work function) and combinations of the materials.

A contact plug CP1 is disposed on the gate electrode 11. An interconnect (metal layer) L1 is disposed on the contact plug CP1. A contact plug CP2 is disposed on the source diffusion layer 13. An interconnect L2 is disposed on the contact plug CP2. A contact plug CP3 is disposed on the drain diffusion layer 14. An interconnect L3 is disposed on the contact plug CP3.

Via the interconnects L1 to L3 and the contact plugs CP1 to CP3, voltages for operation of the transistor 1 are applied to a gate, a source, and a drain of the transistor and an output current is output from the transistor 1.

The field effect transistor 1 in the present embodiment is a tunnel transistor 1.

In the tunnel transistor 1, a conductivity type of the source diffusion layer 13 is different from a conductivity type of the drain diffusion layer 14.

In the tunnel transistor 1 in the present embodiment, the conductivity type of the source diffusion layer 13 is a p type, and the conductivity type of the drain diffusion layer 14 is an n type. The p-type source diffusion layer 13 is an impurity semiconductor layer containing boron (B). The n-type drain diffusion layer 14 is an impurity semiconductor layer containing phosphor (P) or arsenic (As).

The p-type source diffusion layer 13 has an impurity concentration (p-type dopant concentration) of approximately $10^{20}$ cm$^{-3}$ to $10^{21}$ cm$^{-3}$. The n-type source diffusion layer 14 has an impurity concentration (n-type dopant concentration) of approximately $10^{20}$ cm$^{-3}$ to $10^{21}$ cm$^{-3}$.

For example, the semiconductor region 100 is a p-type semiconductor region (p-type well region). A channel region 19 below the gate electrode 11 is a p-type semiconductor region.

The impurity concentration (p-type dopant concentration) of the p-type channel region 19 is lower than the impurity concentration (p-type dopant concentration) of the p-type source diffusion layer 13. For example, the p-type semiconductor region 100 and channel region 19 have an impurity concentration of, for example, approximately $10^{16}$ cm$^{-3}$ to $10^{18}$ cm$^{-3}$.

The tunnel transistor 1 has a PN junction between the n-type drain diffusion layer 14 and the p-type channel region/p-type source diffusion layer 19 and 13.

For example, the tunnel transistor 1 with the p-type source diffusion layer and the n-type drain diffusion layer in the p-type semiconductor region as is the case with the tunnel transistor in FIG. 1 is referred to as an n-mode tunnel transistor.

A tunnel transistor with an n-type source diffusion layer and a p-type drain diffusion layer in an n-type semiconductor region is referred to as a p-mode tunnel transistor.

The tunnel transistor 1 in the present embodiment has an n-type well region 132 between a bottom portion (bottom surface) of the p-type source diffusion layer 13 and the p-type semiconductor region 100.

A top portion (top surface) of the n-type well region 132 contacts a bottom portion of the source diffusion layer 13. For example, in a direction perpendicular to a front surface of the semiconductor region 100, the bottom portion of the n-type well region 132 is positioned closer to the front surface of the semiconductor region 100 (closer to the source diffusion layer) than a bottom portion of the element isolation insulating layer 90.

In a direction parallel to the front surface of the semiconductor region (substrate) 100 (channel length direction), a side portion (side surface) of the n-type well region 132 is retracted toward the element isolation insulating layer 90 with respect to a side portion of the p-type source diffusion layer 13.

For example, in the channel length direction of the transistor, a distance D1 between the n-type well region 132 and the n-type drain diffusion layer 14 is longer than a distance D2 between the p-type source diffusion layer 13 and the n-type drain diffusion layer 14. For example, in a direction (channel length direction) parallel to the front surface of the semiconductor region (substrate) 100, a dimension (length) A1 of the n-type well region 132 is smaller than a dimension A2 of the p-type source diffusion layer 13. For example, a distance between the channel region 19 and the well region 132 is approximately equal to the maximum value of the layer thickness of the side wall insulating layer 17 in the channel length direction (film thickness of a bottom portion side of the side wall insulating layer 17).

The relatively long distance set between the channel region and the n-type region 132 allows the tunnel transistor 1 to prevent a current flowing through the channel region from leaking directly to the n-type well region.

In the direction perpendicular to the front surface of the semiconductor region 100, the tunnel transistor 1 has a PN junction between the p-type source diffusion layer 13 and the n-type well region 132.

The n-type well region 132 suppresses punch-through that occurs between the bottom portion of the p-type source diffusion layer 13 and the p-type semiconductor region 100.

The tunnel transistor 1 in the present embodiment includes a region 139 including impurities different from the p- and n-type dopants (hereinafter referred to as an impurity region or a trap region), in a region near the boundary between the p-type source diffusion layer 13 and the n-type well region 132. The impurity region 139 extends across the boundary between the p-type source diffusion layer 13 and the n-type well region 132.

When materials for the source diffusion layer 13 and the well region 132 (semiconductor region 100) contain silicon as a main component, the impurities in the region 139 are a material (element) that forms an impurity level near a central portion (intrinsic level) of a bandgap for silicon.

When the source diffusion layer 13 and the well region 132 contain silicon, the impurities included in the region 139 are at least one type of element selected from a first group including, for example, sulfur (S), zinc (Zn), cobalt (Co), vanadium (V), strontium (Sr), copper (Cu), oxygen (O), iron (Fe), germanium (Ge), and the like.

Sulfur, zinc, cobalt, and oxygen, which exhibit relatively low diffusibility in silicon, are preferably used as impurities added into the region 139. Oxygen functions as a gettering site (crystal fault or strain) in silicon. Therefore, when oxygen is added into the region 139 near a boundary (near a junction) between the p-type source diffusion layer 13 and the n-type well region 132, the distribution of impurities at the PN junction between the p-type source diffusion layer 13 and the n-type well region 132 (the distribution of the p-type/n-type dopants at an interface) is sharp. The impurity region 139 may also include at least one of the p- and n-type dopants in addition to the impurities.

The element in the impurity region 139 selected from the first group has a concentration (impurity concentration) of, for example, $10^{18}$ cm$^{-3}$ or more and $10^{19}$ cm$^{-3}$ or less.

The impurities selected from the first group are distributed in the region 139 near the boundary (near the junction) between the p-type source diffusion layer 13 and the n-type well region 132. The impurities selected from the first group form a trap level in a transition region (depletion layer) for the PN junction between the p-type source diffusion layer 13 and the n-type well region 132.

The impurity region 139 may be disposed only on a part of the boundary between the p-type source diffusion layer 13 and the n-type well region 132. For example, the impurity region (for example, a silicon region including sulfur, zinc, cobalt, oxygen or the like) 139 may be a layer interposed between the p-type source diffusion layer 13 and well region 132 and having an extremely thin film thickness.

(2) Operation Example

The tunnel transistor 1 in the present embodiment operates as follows.

FIG. 2 is a graph illustrating operational characteristics of the tunnel transistor in the present embodiment.

The horizontal axis of the graph in FIG. 2 corresponds to a gate-source voltage Vgs of the tunnel transistor. The vertical axis of the graph in FIG. 2 corresponds to a drain-source current (hereinafter also referred to as an output current) Ids.

In the tunnel transistor 1 in the present embodiment, when a gate voltage Vg is higher than a source voltage Vs, the voltage Vgs has a positive value.

In the tunnel transistor 1 in the present embodiment, when a current Ids flows from the source (p-type diffusion layer) toward the drain (n-type diffusion layer), the current Ids has a positive current value. In the present embodiment, when the tunnel transistor 1 outputs the drain-source current Ids with a positive current value, electrons migrate from the drain to the source.

As illustrated by the voltage-current characteristics (input/output characteristics) of the tunnel transistor 1 in FIG. 2, when the gate-source voltage Vgs with a positive voltage value is applied to the tunnel transistor 1, the tunnel transistor 1 outputs a current Irv with a positive current value.

When the gate-source voltage Vgs of the tunnel transistor 1 increases in a positive direction from 0 V, the drain-source current Irv of the tunnel transistor 1 increases with an increase of the voltage value. When the gate-source voltage Vgs reaches a certain value, the magnitude of the drain-source current Irv tends to be gradually saturated.

As described above, the voltage-current characteristics (input/output characteristics) of the tunnel transistor operating with a positive gate-source voltage Vgs are similar to voltage-current characteristics of a MOS transistor.

For the tunnel transistor with the p-type source diffusion layer and the n-type drain diffusion layer, the operation of the tunnel transistor 1 performed when the gate-source voltage Vgs is positive is hereinafter referred to as a reverse bias operation. Operational conditions for the tunnel transistor operating with a positive gate-source voltage Vgs are hereinafter referred to as reverse conditions (or reverse bias conditions).

The drain-source current Irv of the tunnel transistor 1 is a current (tunnel current) flowing in a reverse bias direction through the PN junction between the p-type source diffusion layer 13 (and the p-type channel region 19) and the n-type drain diffusion layer 14.

The drain-source current Irv (Ids) under the reverse conditions is used as an on current for the tunnel transistor 1.

If the gate-source voltage Vgs with a negative voltage value is applied to the tunnel transistor 1, the tunnel transistor 1 outputs the drain-source current Ids with a positive current value when an absolute value of the applied negative voltage Vgs is increase.

When the gate-source voltage Vgs of the tunnel transistor 1 increases in a negative direction from 0 V, the drain-source current Ids does not flow until the gate-source voltage Vgs reaches a certain negative voltage value (threshold value) V1.

When the gate-source voltage Vgs of the tunnel transistor 1 reaches the threshold value V1, the tunnel transistor 1 outputs a drain-source current Ifw (Ids) with a positive current value.

Thus, the voltage-current characteristics (input/output characteristics) of the tunnel transistor operating with the gate-source voltage Vgs set positive are similar to input/output characteristics of a diode to which a forward bias is applied (PN junction).

For the tunnel transistor with the p-type source diffusion layer and the n-type drain diffusion layer, the operation of the tunnel transistor performed when the gate-source voltage Vgs is negative is hereinafter referred to as a forward bias operation. Operational conditions for the tunnel transistor operating with the gate-source voltage Vgs set negative are hereinafter referred to as forward conditions (or forward bias conditions).

The drain-source current Ifw (Ids) of the tunnel transistor 1 under the forward conditions is a current in a forward bias state flowing through the PN junction between the p-type source diffusion layer 13 (and the p-type channel region 19) and the n-type drain diffusion layer 14.

The maximum value of the drain-source current Ids of the tunnel transistor 1 operating under the forward conditions is smaller than the maximum value of the drain-source current Ids of the tunnel transistor 1 operating under the reverse conditions. The absolute value of a voltage value at which the current in the tunnel transistor 1 under the forward conditions rises (threshold voltage) is larger than the absolute value of a voltage value at which the current in the tunnel transistor 1 under the reverse conditions rises (threshold voltage).

The tunnel transistor 1 utilizes a tunnel effect of the PN junction between the drain and the channel based on band modulation resulting from a field effect, to achieve output of a current and turn-on and turn-off of the transistor. Therefore, the tunnel transistor 1 can operate on a lower voltage than field effect transistors in which the source and the drain have the same conductivity types.

Furthermore, the tunnel transistor 1 has only a small off-leak current. Thus, the power consumption of the tunnel transistor 1 can be reduced. The tunnel transistor 1 has a steep on/off characteristic.

In the tunnel transistor 1 in the embodiment, the impurity region 139 at the boundary (interface) between the source diffusion layer 13 and the n-type well region 132 serves to reduce the drain-source current Ifw of the tunnel transistor 1 under the forward conditions.

FIG. 3 is a diagram schematically illustrating an operating state of the tunnel transistor 1 in the present embodiment under the forward conditions.

As depicted in FIG. 3, under the forward conditions for the tunnel transistor 1, a potential at an L level is applied to the gate electrode 11 of the tunnel transistor 1, a potential at an H level is applied to the p-type source diffusion layer 13, and the potential at the L level is applied to the n-type drain diffusion layer 14.

Under the forward conditions for the tunnel transistor 1, a forward bias is applied to the PN junction between the p-type source diffusion layer 13 and the n-type well region 132.

Under the forward conditions for the tunnel transistor 1, electrons migrate between the n-type well region 132 and the p-type source diffusion layer 13 to generate a current ILK. The current ILK is hereinafter referred to as a substrate leak current ILK.

The electrons migrate in a direction from the n-type well region 132, which is closer to the substrate, toward the p-type source diffusion layer 13. The substrate leak current ILK flows from the p-type source diffusion layer 13 to the n-type well region 132.

When the impurity region 139 is disposed near the boundary between the p-type source diffusion layer 13 and the n-type well region 132 as in the present embodiment, the substrate leak current ILK flows more easily than the drain current Ids under the forward conditions for the tunnel transistor 1.

Therefore, under the forward conditions for the tunnel transistor 1, the substrate leak current ILK increases, while the current Ids from the source diffusion layer 13 toward the drain diffusion layer 14 decreases.

As a result, the current value of the drain-source current Ifw of the tunnel transistor 1 under the forward conditions decreases.

FIG. 4 is a diagram schematically depicting a band gap structure of the tunnel transistor in the present embodiment.

FIG. 4 schematically depicts the band gap structure of the p-type source diffusion layer-the n-type well region-the p-type well region under the forward conditions for the tunnel transistor 1. In FIG. 4, a material for the diffusion layer and the wells is silicon.

As depicted in FIG. 4, the impurities (for example, oxygen) in the impurity region 139 form an impurity level (deep level) Et near the center of the band gap of silicon and act as a trap factor for silicon.

The impurities (for example, sulfur, zinc, cobalt, oxygen, or the like) in the impurity region 139 form a trap level (impurity level) Et in a transition region 300 for the PN junction between the p-type source diffusion layer and the n-type well region. The impurities in the impurity region 139 form the trap level near a mid-gap for silicon (an intermediate energy level between a valence band and a conduction band). The impurities forming the trap level near the mid gap are easily thermally excited.

Under the forward conditions for the tunnel transistor 1, when a small electric field is applied to the PN junction 13 and 132, a factor for trapping of electrons is substantially equal to a factor for SRH recombination of electrons.

Under the forward conditions for the tunnel transistor 1, the thermal excitation of the impurities in the impurity region 139 is dominant.

Therefore, under the forward conditions for the tunnel transistor 1, tunneling of electrons (e⁻) from the trap level is caused by thermal excitation (or tunneling of the electrons via the trap level occurs), increasing electrons (carriers) in the conduction band (for example, the conduction band in the n-type well region 132). As a result, the current ILK flows more easily through the PN junction between the p-type source diffusion layer 13 and the n-type well region 132 than the current in the case where the impurity region (trap level) 139 is not present in the transition region 300.

Consequently, in the tunnel transistor 1 in the present embodiment, while the tunnel transistor 1 is operating under the forward conditions, it becomes easier for the substrate leak current ILK to flow between the p-type source diffusion layer 13 and the n-type well region 132 than the source-drain current Ids.

Under the reverse conditions, an inter-band transition is dominant as a transition of electrons through the PN junction between the n-type well region 132 and the p-type source diffusion layer 13.

Therefore, the trap level associated with the impurities in the transition region 300 does not substantially affect the operation of the tunnel transistor under the reverse conditions. Thus, even when the trap level 139 is present in the transition region 300, the output current from the tunnel transistor under the reverse conditions does not substantially decrease.

As described above, the output current Ifw from the tunnel transistor 1 with an impurity region 139 in the present embodiment under the forward bias conditions is smaller than an output current Iz from a tunnel transistor with no impurity region under the forward bias conditions, as depicted in FIG. 2.

For example, when the resistance between the p-type source diffusion layer 13 and the p-type channel region 19 (hereinafter referred to as tunnel resistance) is represented as "RT" and the resistance between the p-type source diffusion layer 13 and the n-type well region 132 with the impurity region 139 interposed between the p-type source diffusion layer 13 and the n-type well region 132 (hereinafter referred to as junction resistance) is represented as "RJ", the relation between the tunnel resistance RT and the junction resistance RJ may be represented as RT>>RJ.

As described above, the tunnel transistor 1 in the present embodiment enables an effective increase in the tunnel resistance (source-channel resistance) RT under the forward condition. For example, the current amount of the substrate leak current ILK is larger than the current amount of the source-drain current Ids.

The tunnel transistor 1 in the present embodiment allows the output current (forward current) Ifw under the forward conditions to be adjusted without any change in the magnitude of the output current (reverse current and the on current of the transistor) Irv under the reverse conditions.

Therefore, the tunnel transistor in the present embodiment enables an increase in the ratio between the output current under the reverse conditions and the output current under the forward conditions.

The tunnel transistor in the present embodiment may be a p-mode tunnel transistor. In the present embodiment, the p-mode tunnel transistor includes a p-type drain diffusion layer and an n-type source diffusion layer in an n-type semiconductor region. A p-type well region is disposed between a bottom portion of the n-type source diffusion layer and a semiconductor region. At least one type of impurities belonging to the first group (for example, sulfur, zinc, cobalt, oxygen or the like when the semiconductor region is silicon) are added into a region near the boundary between the p-type well region and the n-type source diffusion layer.

As described above, the tunnel transistor 1 in the present embodiment allows the current Ifw to be suppressed under the forward conditions without any change in the characteristics of the current Irv under the reverse conditions.

Therefore, the tunnel transistor in the present embodiment can achieve stable operations.

(3) Manufacturing Method

A method for manufacturing a field effect transistor in the present embodiment will be described with reference to FIGS. 5 to 8. FIGS. 5 to 8 depict the sectional structure of the tunnel transistor 1 in the channel length direction in each manufacturing process of the tunnel transistor 1.

As depicted in FIG. 5, a p-type well region with a low concentration (for example, approximately $10^{18}$ cm$^{-3}$) is formed in a semiconductor region (for example, a silicon substrate) enclosed by the element isolation insulating layer 90.

On the semiconductor region (the p-type well region in the substrate) 100, the insulating layer 12 is formed using CVD, ALD, thermal oxidation, or the like.

The conductive layer 11 is formed on the insulating layer 12 using, for example, CVD or sputtering.

A mask layer (for example, a resist mask) 190 is formed on the conductive layer 11. The mask layer 190 is processed by photolithography and etching so as to have a pattern corresponding to a gate pattern for the transistor (planar shape of the gate).

Based on the patterned mask layer 190, the conductive layer 11 and the insulating layer 12 are processed by, for example, RIE (Reactive Ion Etching).

Consequently, the gate electrode 11 with the certain gate pattern is formed on the insulating layer (gate insulating layer) 12. For example, the etching of the gate insulating layer 12 may be omitted.

As the materials for the gate electrode 11 and the gate insulating layer 12, the above-described materials may be used as needed.

Figure 6:
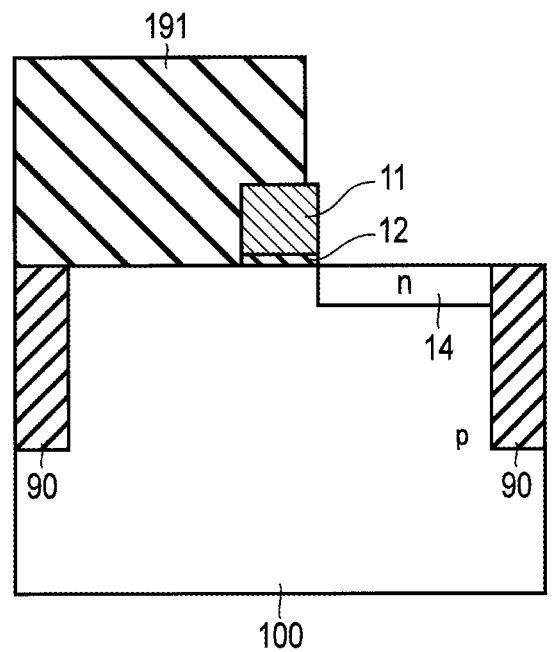

As depicted in FIG. 6, after the gate electrode 11 is formed, a mask layer 191 is formed on the semiconductor region 100 so as to cover a top surface of semiconductor region 100 on a side of one end of the gate electrode 11 in the channel direction.

With the mask layer 191 covering a part of a top surface of the semiconductor region 100, an ion implantation of an n-type dopant is performed. Consequently, the n-type diffusion layer 14 is formed in an exposed region of the semiconductor region 100. The dose of the ion implantation is set so that the n-type diffusion layer 14 has an n-type dopant concentration of, for example, approximately $10^{21}$ cm$^{-3}$.

In the present embodiment, the region in which the n-type diffusion layer 14 is formed (the semiconductor region on the side of the one end of the gate electrode) is a drain region of the tunnel transistor (hereinafter also referred to as a drain formation region).

At the time of formation of the n-type drain diffusion layer 14, the region covered with the mask layer 191 (the well region at the second end of the gate electrode) is a region in which a source region of the tunnel transistor (p-type source diffusion layer) is to be formed (hereinafter also referred to as a source formation region).

Figure 7:
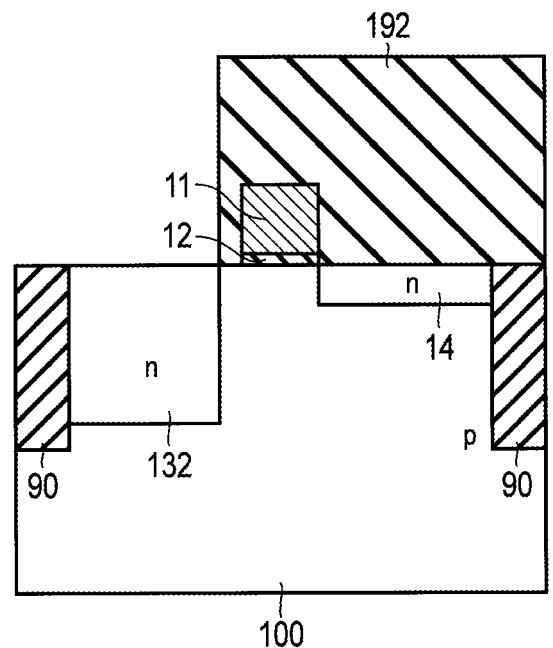

After the mask layer used to form the n-type drain diffusion layer 14 is removed, a mask layer 192 is formed on the semiconductor region 100 so as to expose the source formation region as depicted in FIG. 7. A top surface of the n-type drain diffusion layer 14 is covered with the mask layer 192.

An ion implantation of an n-type dopant is performed with the source formation region exposed. Consequently, in the region in which the source of the tunnel transistor 1 is formed, the n-type well region 132 with a low concentration (for example, approximately $10^{18}$ cm$^{-3}$) is formed in the semiconductor region 100.

When the n-type well region 132 is formed, the mask layer 192 is preferably formed so as to cover a side surface of the gate electrode 11 in the source formation region side of the tunnel transistor. Then, the n-type well region 132 is formed in a region away from a region immediately below the gate electrode 11. Therefore, a certain distance is provided between the n-type well region 132 and the channel region of the tunnel transistor.

Figure 8:
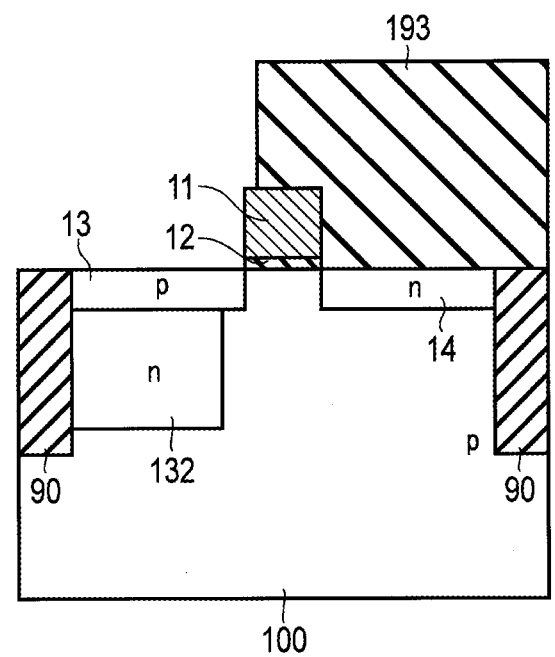

After the mask layer is removed, a mask layer 193 is formed as depicted in FIG. 8. The mask layer 193 covers the top surface of the n-type drain diffusion layer 14. The top surface of the n-type well region 132 and the side surface of the gate electrode 11 closer to the source region are exposed. The mask layer 193 may be formed by etching a part of the mask layer used to form the n-type well region 132.

Based on the mask layer 193, an ion implantation of a p-type dopant is performed. The p-type diffusion layer 13 is formed in the n-type well region 132. Consequently, the p-type source diffusion layer 13 is formed in the source region of the tunnel transistor 1. The dose of the ion implantation is set such that the p-type diffusion layer 13 has a p-type dopant concentration of, for example, approximately $10^{21}$ cm$^{-3}$.

After the p-type source diffusion layer 13 is formed, the n-type well region 132 may be formed in a region below the p-type source diffusion layer 13 (a region closer to the substrate).

Using the mask layer 193 that forms the p-type source diffusion layer 13, ion implantation is performed to implant impurities for silicon.

The impurities to be implanted are at least one type of element selected from the first group including sulfur (S), zinc (Zn), cobalt (Co), vanadium (V), strontium (Sr), copper (Cu), oxygen (O), iron (Fe), and germanium (Ge) and the like.

In the ion implantation of impurities, acceleration energy for ions is controlled to add the impurities (for example, oxygen) to the vicinity of the boundary between the p-type source diffusion layer 13 and the n-type well region 132. The dose of ions is controlled so that the impurities implanted in the region have a concentration of $10^{18}$ cm$^{-3}$ or more and $10^{19}$ cm$^{-3}$ or less.

By the ion implantation, an impurity region 139 is formed in the p-type source diffusion layer 13 and the n-type well region 132 so that the impurities are districted across the boundary between the p-type source diffusion layer 13 and the n-type well region 132 as depicted in FIG. 1.

In the ion implantation, formation positions of the diffusion layer, the well region and the impurity region may be controlled using, in addition to the shape of the mask layer, a control of the incident angle of ions to the substrate front surface.

After the mask layer is removed, the side wall insulating layer 17 is formed on the side surface of the gate electrode 11. After an interlayer insulating layer (not depicted in the drawings) is formed on the semiconductor region 100, the contact plugs CP1, CP2, and CP3 are formed on the gate electrode 11 and the source/drain diffusion layers 13 and 14, respectively. The interconnects L1, L2, and L3 are formed on the contact plugs CP1, CP2, and CP3, respectively.

In the above-described manufacturing steps, the tunnel transistor of the present embodiment is formed.

(4) Application Example

Figure 10:
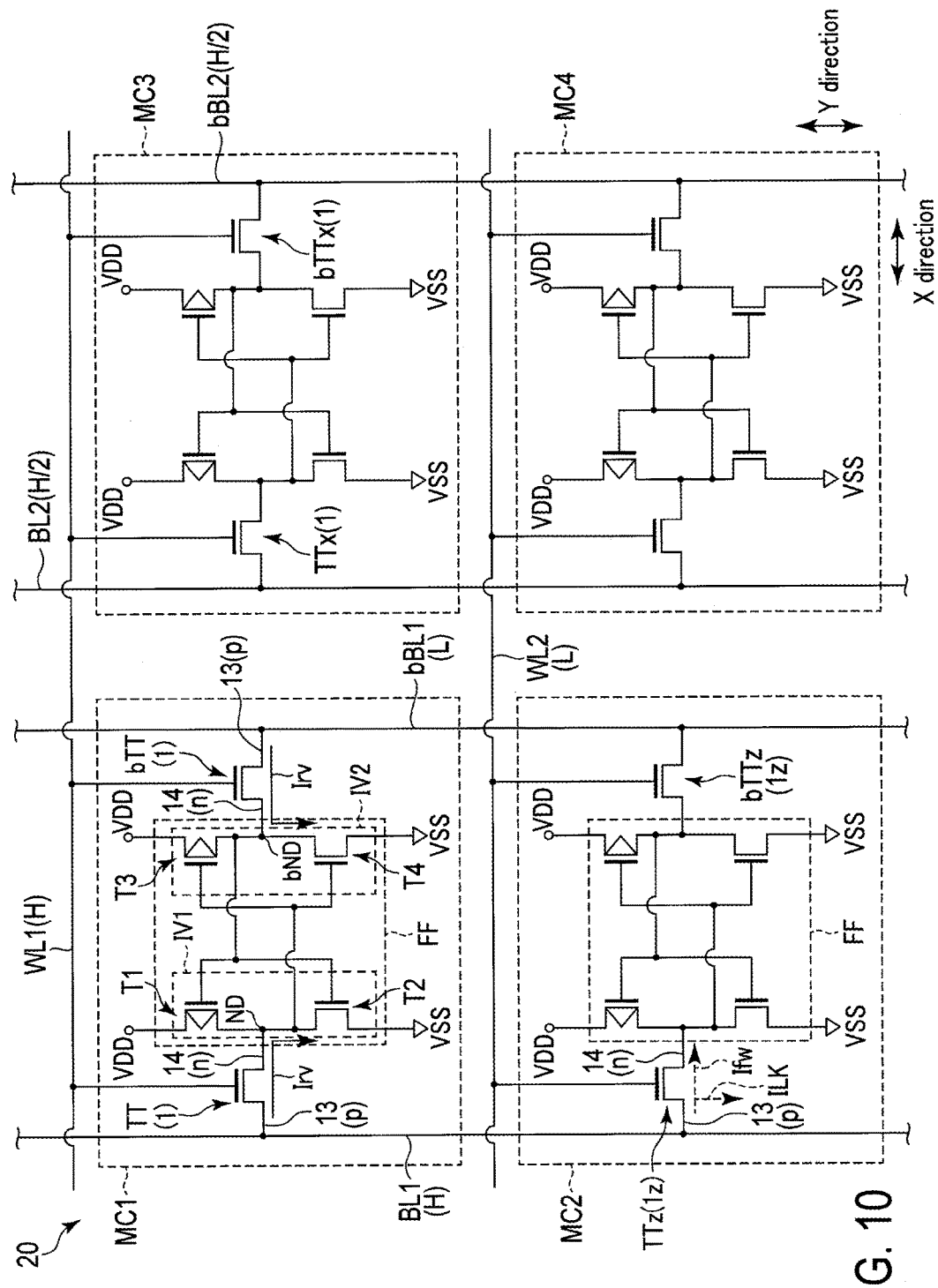

With reference to FIG. 9 and FIG. 10, an application example of the field effect transistor (tunnel transistor) in the present embodiment will be described. The application example of the tunnel transistor of the present embodiment will be described using FIGS. 1 to 8 in addition to FIG. 9 and FIG. 10.

(a) Configuration

Using FIG. 9 and FIG. 10, a configuration example of a semiconductor device including the tunnel transistor in the present embodiment will be described.

The tunnel transistor 1 in the present embodiment is used, for example, in a SRAM (Static RAM).

FIG. 9 is a block diagram depicting an example of a main part of the SRAM.

The SRAM 200 includes at least a memory cell array 20, a row control circuit 21, a column control circuit 22, and an internal control circuit (sequencer) 23 and the like.

The SRAM 200 performs operations (data writing and data reading) on addresses in the memory cell array 20 designated by an external device (memory controller or host device) based on commands from the external device.

The memory cell array 20 includes a plurality of memory cells MC. The memory cells MC are connected to bit line pairs BP and word lines WL.

The bit line pair BP includes two bit lines BL and bBL. The bit line BL is connected to one end of the memory cell MC. The other bit line bBL is connected to the other end of the memory cell MC.

The word line WL is connected to a control terminal of the memory cell MC.

The sequencer 23 controls operations of the row control circuit 21 and the column control circuit 22 based on commands and control signals from the external device.

The row control circuit 21 controls rows (word lines WL) in the memory cell array 20 based on row addresses (selected row addresses) from the external device.

The column control circuit 22 controls columns (bit lines BL) in the memory cell array 20 based on column addresses (selected column addresses) from the external device. The column control circuit 22 includes a sense amplifier and a write circuit. The sense amplifier detects a variation in the potential/current of each of the bit lines BL and bBL when data is read from the memory cell MC. The write circuit controls the potential of each of the bit lines BL and bBL when data is written to the memory cell MC.

FIG. 10 is a circuit diagram depicting a circuit configuration of the memory cell array in the SRAM including the tunnel transistor 1.

As depicted in FIG. 10, in the memory cell array 20, a plurality of the memory cells MC (MC1, MC2, MC3, MC4) are arranged in an X direction and a Y direction. The plurality of memory cells MC arranged in the X direction is connected to common word lines WL (WL1, WL2).

The plurality of memory cells MC arranged in the Y direction is connected to a common bit line pair. Each memory cell MC is connected to two bit lines BL (BL1, BL2) and bBL (bBL1, bBL2) that form a bit line pair.

Each memory cell MC includes a data holding circuit FF and transfer gates (pass transistors) TT and bTT.

The data holding circuit FF and the transfer gates TT and bTT include a plurality of field effect transistors.

In the example illustrated in FIG. 10, the memory cell MC in the SRAM 100 includes six field effect transistors.

The data holding circuit FF is a flip flop circuit. The flip flop circuit includes two inverters IV1 and IV2 cross-coupled together.

The inverter IV1 includes a p-type transistor T1 and an n-type transistor T2. A source of the p-type transistor T1 is connected to a terminal to which a power supply voltage VDD is applied (hereinafter referred to as a power supply terminal VDD). A source of the n-type transistor T2 is connected to a terminal to which a ground voltage VSS is applied (hereinafter referred to as a ground terminal VSS).

A drain of the p-type transistor T1 is connected to a drain of the n-type transistor T2. The connected drains of the p- and n-type transistors T1 and T2 form an output node ND of the inverter IV1.

A gate of the p-type transistor T1 is connected to a gate of the n-type transistor T2.

The connected gates of the p- and n-type transistors T1 and T2 form an input node of the inverter IV1.

The other inverter IV2 includes a p-type transistor T3 and an n-type transistor T4. A source of the p-type transistor T3 is connected to the power supply terminal VDD. A source of the n-type transistor T4 is connected to the ground terminal VSS.

A drain of the p-type transistor T3 is connected to a drain of the n-type transistor T4. The connected drains of the p- and n-type transistors T3 and T4 form an output node bND of the other inverter IV2.

A gate of the p-type transistor T3 is connected to a gate of the n-type transistor T4. The connected gates of the p- and n-type transistors T3 and T4 form an input node of the inverter IV2.

The input node of the inverter IV1 is connected to the output node of the other inverter IV2. The output node of the inverter IV1 is connected to the input node of the other inverter IV2.

The output node ND of the inverter (T1 and T2) serves as a non-inverted input/output terminal of the flip flop circuit FF. The output node bND of the inverter (T3 and T4) serves as an inverted input/output terminal of the flip flop circuit FF.

Instead of the p-type transistors T1 and T3, resistance elements (for example, resistance elements including diffusion layers) may be connected to the n-type transistor T2 and T4, respectively.

The tunnel transistor 1 in the present embodiment is used for the transfer gates TT and bTT in the memory cell.

One end of a current path in the tunnel transistor 1 serving as one transfer gate (transfer gate on the inverter IV1 side) TT is connected to the non-inverted input/output terminal ND of the flip flop circuit FF. The other end of the current path in the tunnel transistor 1 is connected to the bit line BL.

One end of a current path in the tunnel transistor 1 serving as the other transfer gate (transfer gate on the inverter IV2 side) bTT is connected to the non-inverted input/output terminal ND of the flip flop circuit FF. The other end of the current path in the tunnel transistor 1 is connected to the bit line bBL. In the memory cell MC, the gates of the two tunnel transistors 1 are connected to the common word line WL.

In the transfer gates TT and bTT in the SRAM 200 in the present example, the p-type source diffusion layer 13 in the tunnel transistor 1 depicted in FIG. 1 is connected to the bit lines BL and bBL. The n-type drain diffusion layer 14 in the tunnel transistor 1 depicted in FIG. 1 is connected to the nodes ND and bND of the flip flop circuit FF.

The transistors T1 to T4 in the flip flop circuit FF may each be the tunnel transistor in the present embodiment or a field effect transistor in which the source and the drain have the same conductivity types.

(b) Operation Example (b-1) Write Operation

A write operation will be described which is performed on the SRAM including the tunnel transistor 1 in the present embodiment.

A write operation will be described which is performed when "1(H)" data is written to a memory cell with "0(L)" data stored therein. In the memory cell with "0(L)" data stored therein, the potential of the node ND of the flip flop circuit FF is at an L (Low) level, and the potential of the node bND is at an H (High) level.

At the time of data writing, the SRAM 200 in the application example receives a write command and a selected address from the memory controller (not depicted in the drawings). For example, based on the selected address, the memory cell MC1 is selected among the plurality of memory cells in FIG. 10 as a data write target memory cell (hereinafter referred to as a selected cell).

One of the plurality of bit line pairs (in this case, the bit line pair including the bit lines BL1 and bBL1) is selected. In the selected bit line pair (hereinafter referred to as the selected bit line pair) BP, the potential of one of the bit lines (for example, the bit line BL1) is set to the H level, and the potential of the other bit line (for example, the bit line bBL1) is set to the L level, according to the data written to the memory cell MC. For example, the H level corresponds to a value within the range from approximately 0.5 V to 1 V. The L level is, for example, 0 V (Vss).

In the bit line pairs other than the bit line pair which is selected (hereinafter referred to as the unselected bit lines), the potential of the unselected bit lines (in this case, the bit lines BL2 and bBL2) is set to a value approximately half of the potential corresponding to the H level, or set to a floating state. However, the potential of the bit lines BL2 and bBL2 in the unselected bit line pair may be set to the H level or the L level as long as the data writing does not occur on an unselected memory cell MC.

The row control circuit 21 selects one of the plurality of word lines WL (in this case, the word line WL1) corresponding to the selected address. The row control circuit 21 sets the potential of the word line WL1 which is selected (hereinafter referred to as the selected word line) to the H level. The row control circuit 21 sets the potential of the word lines WL2 other than the selected word line (hereinafter referred to as the unselected word lines) to the L level.

Furthermore, a voltage value of the H level to the word line WL may be different from a voltage value of the H level to the bit line BL for an improvement of an operation speed and/or a stabilization of the operation. The voltage value of the H level to the word line WL may be equal to or higher than the voltage value of the H level to the bit line BL. The voltage value of the H level to the word line WL may be a voltage value between the voltage value of the H level to the bit line BL and the voltage value (for example, a grand voltage Vss) of the L level to the bit line. However, the voltage value of the H level to the word line WL is higher than the voltage value of the L level to the bit line BL.

Setting the potential of the selected word line WL1 to the H level causes the transfer gates TT and bTT (tunnel transistor 1) in the selected cell MC1 to be turned on.

Consequently, the nodes ND and bND of the flip flop circuit FF in the selected cell MC1 are made electrically continuous with the bit lines BL1 and bBL1 via the transfer gates TT and bTT, respectively.

When the signal level of the bit line is at the H level (or the L level) and the signal level of the node of the flip flop circuit FF is at the L level (or the H level), a current is generated due to a difference in potential between the bit line and the node. The generated current serves as a write current to allow the data to be written to the memory cell.

When the transfer gates TT and bTT in the selected cell MC are the tunnel transistors 1, in the tunnel transistor 1 at a side of the H level bit line BL, an H level potential (the potential of the bit line BL) is applied to the p-type source diffusion layer 13 in the tunnel transistor 1(TT).

When the potential of the node ND is at the L level, an L level potential (the potential of the node ND) is applied to the n-type drain diffusion layer 14 in the tunnel transistor 1. The H level potential is applied to the gate electrode of the tunnel transistor 1.

On the other hand, in the tunnel transistor 1 (bTT) on a side of the L level bit line bBL, the L level potential is applied to the p-type source diffusion layer 13 in the tunnel transistor 1.

The potential of the node bND has a complementary relation with the potential of the node ND. When the potential of the node ND is at the L level, the potential of the node bND is at the H level. Therefore, the H level potential is applied to the n-type drain diffusion layer 14 in the tunnel transistor 1. The H level potential is applied to the gate electrode of the tunnel transistor 1 (bTT).

In the memory cell (selected cell) MC1 with the above-described relations between the potentials of the bit line pair BL1 and bBL1 and the potentials of the nodes ND and bND in the memory cell MC1, the tunnel transistor 1(bTT) serving as the transfer gate on the side of the L level bit line bBL falls under the reverse conditions. The transistor 1(TT) serving as the transfer gate on a side of the H level bit line BL has a very small potential difference between the gate and the source (the potential difference is substantially zero).

In the memory cell in which the tunnel transistors 1 are used as transfer gates, the potential of the node bND is changed from H level to L level by the driving force (output current) of the tunnel transistor 1 under the reverse conditions, in this case, the driving force of the tunnel transistor 1 connected to the L level bit line bBL (bTT). In conjunction with a change in the potential of the node bND, the potential of the node ND connected to the H level bit line changes from L level to H level.

Thus "1" data is written to the selected cell MC1.

When the signal level of the bit line BL1 is H level and the signal level of the node ND of the flip flop circuit FF is H level (when the signal level of the bit line bBL1 is L level and the signal level of the node bND of the flip flop circuit FF is L level), the bit line and the node that are made electrically continuous with each other by the transfer gate are at the same potential. In this case, the memory cell MC maintains a state in which the original data (in this case, "1" data) is held without rewriting the data.

An unselected cell (hereinafter referred to as a semi-selected cell) is connected to the same bit line pair to which the selected cell MC1 is connected. In the semi-selected cell (in this case, the memory cell MC2), a transfer gate TTz (tunnel transistor 1z), in which the L level potential is applied to the gate electrode, is connected between the H level bit line BL and the connection node ND of the flip flop circuit FF.

In the tunnel transistor 1z as the transfer gate TTz, the L level potential is applied to the gate electrode, and the H level potential is applied to the p-type source diffusion layer 13.

Moreover, when the potential of the node ND of the memory cell MC2 is at the L level, the L level potential is applied to the n-type drain diffusion layer 14.

In this case, in the tunnel transistor 1z in the semi-selected cell MC2, the relation between the potentials of the terminals corresponds to the relation between the potentials in the tunnel transistor under the forward conditions.

Even when no voltage is applied to the gate electrode, the tunnel transistor 1z outputs a current (forward current) as long as a significant potential difference is present between the p-type source diffusion layer and the n-type drain diffusion layer. Therefore, there is a possibility that a forward current is generated in the tunnel transistor 1z.

When the forward current has a large current value, a current supplied to the node ND may change the potential of the node ND in the semi-selected cell (unselected cell). Thus, if the tunnel transistor outputs a forward current with a large current value, erroneous writing may be executed on the semi-selected cell MC2.

In the present embodiment, impurities (for example, oxygen) are added into the region 139 near the boundary between the source diffusion layer 13 and the n-type well region 132 of the tunnel transistor 1z as depicted in FIG. 1.

In the tunnel transistor 1z under the forward conditions, the added impurities allow the substrate leak current ILK between the p-type source diffusion layer 13 and the n-type well region 132 to flow more easily than the current between the p-type source diffusion layer 13 and the n-type drain diffusion layer 14 as depicted in FIG. 3. In the tunnel transistor 1z under the forward conditions, the effective source-channel resistance RT is higher than the source-well resistance RJ.

As a result, a reduced forward current Ifw is supplied to the node ND of the flip flop circuit FF.

As a result, in the unselected cell MC2 connected to the same bit lines BL1 and bBL1 to which the selected cell MC1 is connected, erroneous data writing is suppressed which is caused by the forward current Ifw in the tunnel transistor 1z.

In order to prevent erroneous writing to the unselected cell caused by the forward current, the SRAM including the tunnel transistors 1 and 1z in the present embodiment needs not reduce the voltages of the bit lines BL and bBL for a reduction of the forward current.

Therefore, the SRAM including the tunnel transistor in the present embodiment allows prevention of a reduced speed of the memory caused by a reduction of a voltage in a write operation.

In the memory cell MC2, when the potential of the node ND is at the L level, the potential of the node bND is at the H level. Therefore, the H level potential is applied to the n-type drain diffusion layer 14 in a tunnel transistor bTTz. Furthermore, the potential of the bit line bBL is at the L level. In this case, in the tunnel transistor bTTz, a potential difference occurs between the p-type source diffusion layer and the n-type drain diffusion layer.

However, the potential of the word line WL is at the L level, and thus, in the tunnel transistor bTTz (1z), the L level potential is applied to the gate electrode. Therefore, the potential difference between the gate and the source of the tunnel transistor bTTz (1z) is substantially zero, preventing the tunnel transistor bTTz (1z) from outputting a current.

If, in the semi-selected cell MC2, the signal level of the connection node ND on a side of the bit line BL1 in the flip flop circuit FF is H level, the potential difference between the source and the drain of the tunnel transistor 1z (TTz) is small and practically zero. In this case, the potential of the connection node bND of the semi-selected cell MC2 is at the L level, and the potential difference between the source and the drain of the tunnel transistor 1z (bTTz) is practically zero.

Therefore, when practically no potential difference is present between the selected bit lines BL and bBL and the nodes ND and nND of the semi-selected cell MC2, no erroneous writing is performed on the semi-selected cell MC2.

Furthermore, in the memory cell array 20, an unselected cell connected to the selected word line (in the present example, a memory cell MC3) is present. In the unselected cell MC3 connected to the selected word line, the potentials of the unselected bit lines BL2 and bBL2 are set to a value between the H level and the L level (for example, a potential approximately half of the H level). In this case, there is only a small potential difference between the drain and the source of the tunnel transistor 1 serving as each of the transfer gates TTx and bTTx. Thus, the tunnel transistor 1 under the forward conditions does not output any large drain-source current (a current large enough to rewrite the data). In this manner, the potentials of the unselected bit lines BL and bBL are controlled so as to avoid generating a current that changes the potential of the node of the unselected cell MC3.

When "0" data is written to a memory cell with "1" data stored therein (for example, the memory cell MC1), the potential of the bit line BL1 is set to the L level, and the potential of the bit line bBL1 is set to the H level. In this case, the tunnel transistor 1 at a side of the L level bit line BL1 (TT) operates under the reverse bias conditions. Consequently, the "0" data is written to the selected cell.

For the semi-selected cell connected to the same bit line pair as the selected cell, the tunnel transistor 1 connected between the H level bit line bBL1 and the L level node bND may operate under the forward conditions. The tunnel transistor 1 in the present embodiment enables a reduction in the output current from the tunnel transistor under the forward conditions using the substrate leak current. Therefore, even when "0" data is written to the selected cell MC, erroneous data writing can be suppressed which is caused by the tunnel transistor under the forward conditions in the unselected cell.

As described above, the write operation is performed on the SRAM including the tunnel transistor in the present embodiment.

The tunnel transistor 1 serving as a transfer gate includes impurities in the boundary region between the source diffusion layer 13 and the n-type well region 132 to suppress the output current from the transistor under the forward conditions.

As a result, erroneous writing to the unselected cell connected to the selected bit line is suppressed.

Therefore, the SRAM including the tunnel transistor in the present embodiment can perform stable operations.

(b-2) Read Operation

Now, a read operation will be described which is performed on the SRAM including the tunnel transistor in the present embodiment.

At the time of data reading, the SRAM 200 in the present application example receives a read command, a selected row address, and a selected column address from the memory controller (not depicted in the drawings).

The sequencer 23 in the SRAM 200 controls operations of the row control circuit 21 and the column control circuit 22 based on the read command.

The column control circuit 22 precharges the selected bit line pair BP indicated by the selected column address. This sets the potentials of the selected bit lines BL and bBL approximately to the H level. The potentials of the precharged selected bit lines BL and bBL may be between the L level and the H level, for example, approximately half of the H level.

After the selected bit lines BL and bBL are charged, the row control circuit 21 sets the potential of the selected word line WL indicated by the selected row address to the H level.

Thus, the transfer gates (tunnel transistor) TT and bTT are turned on to make the bit lines BL and bBL electrically continuous with the nodes ND and bND, respectively, of the flip flop circuit FF.

The potential of the bit line BL changes according to the potentials of the nodes ND and bND. One of the nodes ND and bND is at the L level. The bit line electrically continuous with the L level node of the flip flop circuit FF is discharged. The remaining bit line electrically continuous with the H level node of the flip flop circuit FF maintains a charged state.

The sense amplifier in the column control circuit 22 outputs a signal at a level varying according to the potential difference between the bit lines BL and bBL in the bit line pair BP. This allows data stored in the memory cell MC to be determined.

When the node ND is at the H level (high potential) and the node bND is at the L level (low potential), the potential of the bit line BL is maintained at the H level, and the potential of the bit line bBL is at the L level. In this case, the sense amplifier determines the data in the memory cell MC to be "1" data.

When the node ND is at the L level and the node bND is at the H level, the potential of the bit line BL is at the L level, and the potential of the bit line bBL is maintained at the H level. In this case, the sense amplifier determines the data in the memory cell MC to be "0" data.

As described above, the data in the memory cell MC is read.

Data reading from the memory cell may be performed by detecting variations in the potentials of the bit lines resulting from migration of charge from the nodes ND and bND to the bit lines BL and bBL, respectively, without precharging the bit lines BL and bBL.

As described above, the SRAM in the application example of the present embodiment can achieve stable operations.

(5) Modifications

Figure 11:
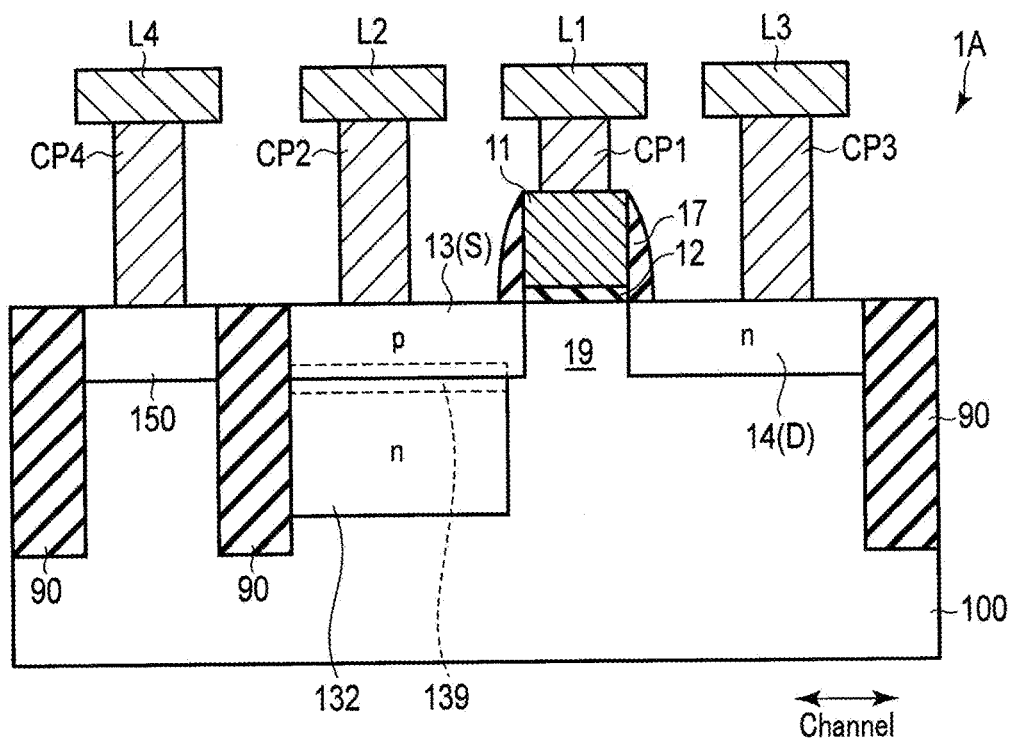
FIG. 11 and FIG. 12 are diagrams depicting a modification of the semiconductor device in the embodiment.
Figure 12:
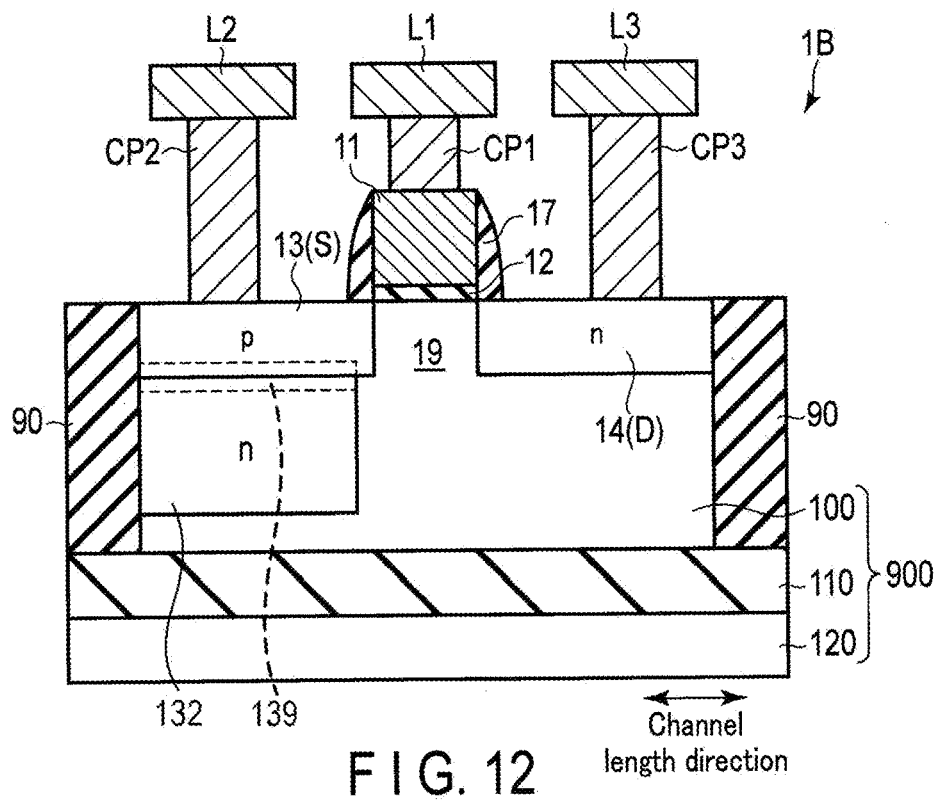
Figure 13:
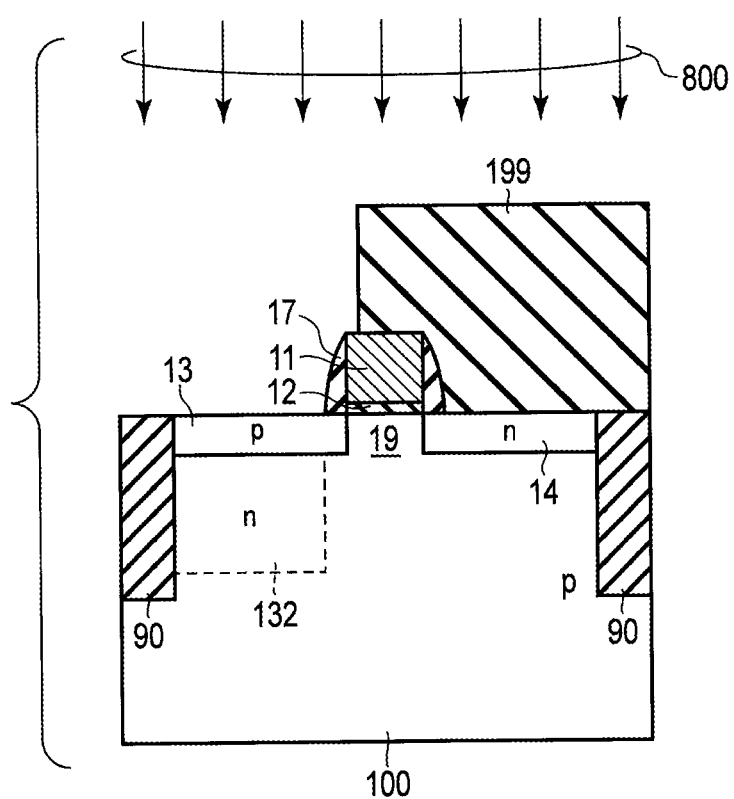
FIG. 13 is a diagram illustrating a modification of the method for manufacturing a semiconductor device in the embodiment.

With reference to FIGS. 11 to 13, modifications of the field effect transistor (tunnel transistor) in the present embodiment will be described.

FIG. 11 is a sectional view illustrating a modification of the tunnel transistor in the present embodiment.

As depicted in FIG. 11, a transistor 1A includes terminals and interconnects used to apply a voltage to a semiconductor region (for example, a p-type well region) 100.

A diffusion layer (for example, a p-type diffusion layer) 150 is disposed in a semiconductor region (p-type well region) 100 in which the transistor 1A is disposed. A contact plug CP4 is disposed on the diffusion layer 150. An interconnect L4 is disposed on the contact plug CP4.

The diffusion layer 150 has a higher impurity concentration (concentration of a p-type dopant) than the semiconductor region 100. The diffusion layer 150 reduces the contact resistance between the contact plug CP4 and the semiconductor region 100.

A voltage (hereinafter referred to as a back bias voltage) Vb is applied to the semiconductor region 100 via the interconnect L4 and the contact plug CP4. The back bias voltage Vb is, for example, 0 V.

The diffusion layer 150 functions as a back gate for the tunnel transistor 1A.

Consequently, the substrate leak current ILK flowing between the p-type source diffusion layer 13 and the n-type well region 132 flows more easily than the current flowing between the p-type source diffusion layer 13 and the n-type drain diffusion layer 14. As a result, a back bias (substrate bias) effect enables a reduction in the output current from the tunnel transistor 1 under the forward conditions.

Therefore, the tunnel transistor 1A in the modification depicted in FIG. 11 allows further suppression of erroneous writing to the non-selected cell in the SRAM.

The contact plug CP4 may be disposed on the n-type well region 132 so as to connect directly to the n-type well region 132.

FIG. 12 is a sectional view illustrating a modification of the tunnel transistor in the present embodiment.

As depicted in FIG. 12, the tunnel transistor 1B in the present embodiment may be disposed on an SOI (Silicon-On-Insulator) substrate 900. The semiconductor region (semiconductor substrate) 100 is disposed on an insulating layer 110 on a bulk substrate 120.

The tunnel transistor 1B on the SOI substrate depicted in FIG. 12 produces the same effects as those of the tunnel transistor 1 on the bulk substrate depicted in FIG. 1.

FIG. 13 is a sectional view illustrating a modification of a method for manufacturing a tunnel transistor in the present embodiment.

As depicted in FIG. 13, the formation position of the n-type well region 132 may be controlled by using the side wall insulating layer 17 on a side surface of the gate electrode 11 as a mask.

In the method for manufacturing a tunnel transistor in FIG. 13, the p-type source diffusion layer 13 and the n-type drain diffusion layer 14 are each formed in the p-type well region 100 before the n-type well region is formed. After the source/drain diffusion layers 13 and 14 are formed, the side wall insulating layer 17 is formed on the side surface of the gate electrode 11.

A mask layer 199 is formed on the semiconductor region 100 so as to expose the top surface of the p-type source diffusion layer 13 and the side wall insulating layer 17 on a side of the p-type source diffusion layer 13. Ion implantation of an n-type dopant is performed so that ions 800 are implanted in a direction perpendicular to the substrate front surface using the mask layer 199 and the side wall insulating layer 17 as a mask. Consequently, the n-type well region 132 is formed below the p-type source diffusion layer 13.

The n-type well region 132 is formed at a position away from the channel region 19 according to the film thickness of the side wall insulating layer 17.

Then, the ion implantation of oxygen or the like are performed using the mask layer 199 and the side wall insulating layer 17 as a mask, to form the impurity region (impurity layer) 139 in the boundary portion between the p-type source diffusion layer 13 and the well region 132.

In the method for manufacturing a tunnel transistor illustrated in FIG. 13, the p-type source diffusion layer 13 may be formed after the side wall insulating layer 17 is formed.

For example, using the mask layer 199 and the side wall insulating layer 17 as a mask, ion implantation is performed in which an ion implantation angle is set obliquely to the substrate front surface (hereinafter referred to as inclined ion implantation).

The inclined ion implantation allows ions to be implanted into a part of the semiconductor region 100 below the side wall insulating layer 17 in the source region of the tunnel transistor 1.

Thus, the p-type source diffusion layer 13 is formed after the side wall insulating layer 17 is formed.

After the p-type source diffusion layer 13 is formed by the inclined ion implantation, ions of an n-type dopant are implanted perpendicularly to the front surface of the semiconductor region 100 to form the n-type well region 132. Consequently, the n-type well region 132 is formed in a part of the semiconductor region 100 below the p-type diffusion layer 13.

When the p-type source diffusion layer 13 is formed by the inclined ion implantation, the n-type well region 132 may be formed before or after the p-type source diffusion layer 13 is formed.

The n-type drain diffusion layer 14 may be formed after the p-type source diffusion layer 13 and the n-type well region 132 are formed.

The tunnel transistor in the modification of the present embodiment described above allows stabilization of the operational characteristics of the tunnel transistor and of a semiconductor device (for example, a SRAM) including the tunnel transistor.

[Other Modifications]

The tunnel transistor in the embodiment may be applied to a logic circuit.

The tunnel transistor in the embodiment may be applied to, for example, a transfer gate in a latch circuit.

The tunnel transistor in the present embodiment may be applied to a semiconductor memory such as a DRAM, a flash memory, an MRAM (for example, an STT-MRAM), a PCRAM, or an ReRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claim is:

1. A semiconductor device comprising:
a first region having a first conductivity type in a semiconductor region;
a second region having a second conductivity type in the semiconductor region;
a gate electrode above a first part of the semiconductor region between the first region and the second region;
a gate insulating layer between the first part and the gate electrode;
a third region having the first conductivity type below the second region; and
a fourth region across the second region and the third region and including a first impurity.

2. The device of claim 1, wherein
when the second region and the third region include silicon,
the first impurity is at least one element selected from a first group consisting of oxygen, sulfur, vanadium, iron, cobalt, copper, zinc, strontium, and germanium.

3. The device of claim 1, wherein
a concentration of the first impurity in the fourth region is $10^{18}$ cm$^{-3}$ or more and $10^{19}$ cm$^{-3}$ or less.

4. The device of claim 1, wherein
the first conductivity type is an n type, and the second conductivity type is a p type, and
a conductivity type of the first part is the p type.

5. The device of claim 1, wherein
when a first potential is applied to the second region, a second potential lower than the first potential is applied to the first region,
a first current flows between the second region and the third region.

6. The device of claim 1, wherein
an end portion of the third region on a side of the first region is distant from the first region than an end portion of the second region on the side of the first region.

7. The device of claim 1, further comprising:
a first interconnect connected to the semiconductor region,
wherein when a fourth potential is applied to the gate electrode, a fifth potential lower than the fourth potential is applied to the semiconductor region via the first interconnect.

8. The device of claim 1, wherein
the semiconductor region is disposed on an insulating layer.

9. A semiconductor memory device comprising:
a first word line;
a first bit line and a second bit line; and
a first memory cell including a first data holding circuit, a first transistor connected between the first data holding circuit and the first bit line, and a second transistor connected between the first data holding circuit and the second bit line,
wherein each of the first and second transistors includes:
a first region disposed in a first semiconductor region and connected to the first data holding circuit, the first region having a first conductivity type;
a second region disposed in the first semiconductor region and connected to the first or second bit line, the second region having a second conductivity type;
a first gate electrode above a first part of the first semiconductor region between the first region and the second region, the first gate electrode connected to the first word line;
a first gate insulating layer between the first part and the first gate electrode;
a third region having the first conductivity type below the second region; and
a fourth region across the second region and the third region and including a first impurity.

10. The device of claim 9, wherein
when the second region and the third region includes silicon,
the first impurity is at least one element selected from a first group consisting of oxygen, sulfur, vanadium, iron, cobalt, copper, zinc, strontium, and germanium.

11. The device of claim 9, wherein
a concentration of the first impurity in the fourth region is $10^{18}$ cm$^{-3}$ or more and $10^{19}$ cm$^{-3}$ or less.

12. The device of claim 9, wherein
the first conductivity type is an n type, and the second conductivity type is a p type, and
a conductivity type of the first part is the p type.

13. The device of claim 9, wherein
when the second region of the first transistor is set to a first potential, the first region of the first transistor is set to a second potential lower than the first potential,
a first current flows between the second region of the first transistor and the third region of the first transistor.

14. The device of claim 9, further comprising:
a second word line; and
a second memory cell including a second data holding circuit, a third transistor connected between the second data holding circuit and the first bit line, and a fourth transistor connected between the first data holding circuit and the second bit line,
wherein each of the third and fourth transistors includes:
a fifth region disposed in a second semiconductor region and connected to the second data holding circuit, the fifth region having the first conductivity type;
a sixth region disposed in the second semiconductor region and connected to the first or second bit line, the sixth region having the second conductivity type;
a second gate electrode above a second part of the second semiconductor region between the fifth region and the sixth region, the second gate electrode connected to the second word line;

a second gate insulating layer between the second part and the second gate electrode;

a seventh region having the first conductivity type below the sixth region; and an eighth region across the sixth region and the seventh region and including the first impurity.

15. The device of claim 14, wherein when the first bit line is set to a first potential, the second bit line is set to second potential lower than the first potential, the first word line is set to a third potential lager than the second potential, and the second word line is set to the second potential, a first current flows between the sixth region of the third transistor connected to the first bit line and the seventh region of the third transistor.

16. The device of claim 15, wherein the fifth region of the third transistor is set to the second potential.

17. The device of claim 15, wherein a second current flows between the second region of the second transistor and the first data holding circuit.

18. The device of claim 9, wherein an end portion of the third region on a side of the first region is distant from the first region than an end portion of the second region on the side of the first region.

19. The device of claim 9, further comprising:

a first interconnect connected to the first semiconductor region, wherein when the first gate electrode of the first transistor is set to a fourth potential, the first semiconductor region is set to a fifth potential lower than the fourth potential via the first interconnect.

20. The device of claim 9, wherein the first semiconductor region is disposed on an insulating layer.

* * * * *